United States Patent
Miyazawa et al.

[11] Patent Number: 5,493,984
[45] Date of Patent: Feb. 27, 1996

[54] TERBIUM ALUMINATE AND METHOD FOR ITS PRODUCTION

[75] Inventors: Yasuto Miyazawa; Masami Sekita, both of Tsukuba; Shoji Morita, Yokohama; Hideyuki Sekiwa, Takahagi, all of Japan

[73] Assignee: National Institute for Research in Inorganic Materials, Tsukuba, Japan

[21] Appl. No.: 187,495

[22] Filed: Jan. 28, 1994

[30] Foreign Application Priority Data

Jun. 24, 1993 [JP] Japan ................... 5-177456

[51] Int. Cl.$^6$ ................... C30B 29/20
[52] U.S. Cl. ................... 117/13; 117/37; 117/48; 117/77; 117/950; 252/301.4 R; 252/301.6 R
[58] Field of Search ................... 252/301.4 R, 301.6 R; 117/13, 37, 48, 77, 78, 950

[56] References Cited

U.S. PATENT DOCUMENTS 4,096,088  6/1978  Ranby et al. ................... 252/301.4 R
4,837,481  6/1989  Verstegen et al. ................... 252/301.4 R

FOREIGN PATENT DOCUMENTS 5-238893  9/1993  Japan.

OTHER PUBLICATIONS

Shishido et al, "Growth of Race Earth Aluminate Crystals From Molten Solutions" Jour. of Alloys and Compounds, 192 (1993) Feb. pp. 84–86.

Primary Examiner—Robert Kunemund
Attorney, Agent, or Firm—Oblon, Spivak, McClelland, Maier & Neustadt

[57] ABSTRACT

A method for producing a single crystal or polycrystal of terbium aluminate containing at least terbium, aluminum and oxygen and represented by the formula $Tb_{1-x}Al_{1+x}O_3$ wherein $-0.5 \leq x \leq 0.5$, which comprises growing the single crystal or polycrystal using a reducing gas atmosphere or a neutral gas atmosphere as an atmosphere for crystal growth.

19 Claims, 4 Drawing Sheets

TERBIUM ALUMINATE AND METHOD FOR ITS PRODUCTION

BACKGROUND OF THE INVENTION

1. Field of the Invention

The present invention relates to a method for producing a single crystal or polycrystal of terbium aluminate, which is useful as a luminescent material such as a laser material or a phosphor.

2. Discussion of Background

Heretofore, a luminescent material has been prepared mainly by incorporating a very small amount of an optically active element to an optically inert matrix. As luminescent materials containing an optically active element as a matrix-constituting element, pentaphosphates (e.g. $NbP_5O_{14}$) are known which were invented in 1970s. However, substances of this type are produced by polymerization of phosphoric acid and thus have many drawbacks, for example, such that the furnace for their synthesis is badly damaged.

On the other hand, $Tb_3Al_5O_{12}$ and $TbAl_3B_4O_{12}$ prepared by a flux method employing lead fluoride as the main flux, have been reported as compounds containing terbium as a matrix-constituting element. Each compound presents a brown or black color. However, such an emission is known to be completely extinct at a liquid nitrogen temperature (i.e. an absolute temperature of 77°), and there is no report that the compound exhibits an emission at room temperature. This is attributable to the fact that by a flux method, it is difficult to control the valence of terbium ions. Namely, terbium is supplied in the form of $Tb_4O_7$ for industrial purposes, and the starting material for synthesis contains trivalent terbium and tetravalent terbium in a ratio of 1:1. Accordingly, by the flux method, it has been difficult to remove tetravalent terbium which is considered to absorb the emission energy, or it is impossible to reduce it to trivalent terbium.

SUMMARY OF THE INVENTION

It is an object of the present invention to solve the above mentioned problems inherent to the conventional methods and to provide a technique for producing a novel luminescent material which shows a strong emission even at a room temperature, efficiently from a material containing terbium as a matrix-constituting element.

The present inventors have conducted extensive researches to accomplish the above object and as a result, have found that $TbAlO_3$ has excellent properties as a luminescent material such as a laser material or a phosphor. They have further found that a reducing atmosphere is decisively important as a condition for growing a single crystal or for synthesizing a polycrystal. Namely, it has been found that by employing a reducing atmosphere, inclusion of tetravalent terbium can be prevented, and the crystal will be colorless transparent and will exhibit an yellowish green or green emission. It has further been found that the reducing atmosphere is effective for preventing cracking of the crystal due to a strain during the growth of the single crystal.

Thus, the present invention provides a method for producing a single crystal or polycrystal of terbium aluminate containing at least terbium, aluminum and oxygen and represented by the formula $Tb_{1-x}Al_{1+x}O_3$ wherein $-0.5 \leq x \leq 0.5$, which comprises growing the single crystal or polycrystal using a reducing gas atmosphere or a neutral gas atmosphere as an atmosphere for crystal growth.

Further, the present invention provides a single crystal or polycrystal of terbium aluminate having a composition containing at least terbium, aluminum and oxygen and represented by the formula $Tb_{1-x}Al_{1+x}O_3$ wherein $-0.5 \leq x \leq 0.5$, which exhibits a green or yellowish green emission even at room temperature in a visible wavelength region.

Furthermore, the present invention provides a single crystal or polycrystal of terbium aluminate having a composition containing at least terbium, aluminum and oxygen and represented by the formula $Tb_{1-x}Al_{1+x}O_3$ wherein $-0.5 \leq x \leq 0.5$, which has no absorption in a visible wavelength region other than absorption from $^7F_6$ multiplet to $^5D_4$ multiplet of terbium.

DETAILED DESCRIPTION OF THE PREFERRED EMBODIMENTS

Figure 1:
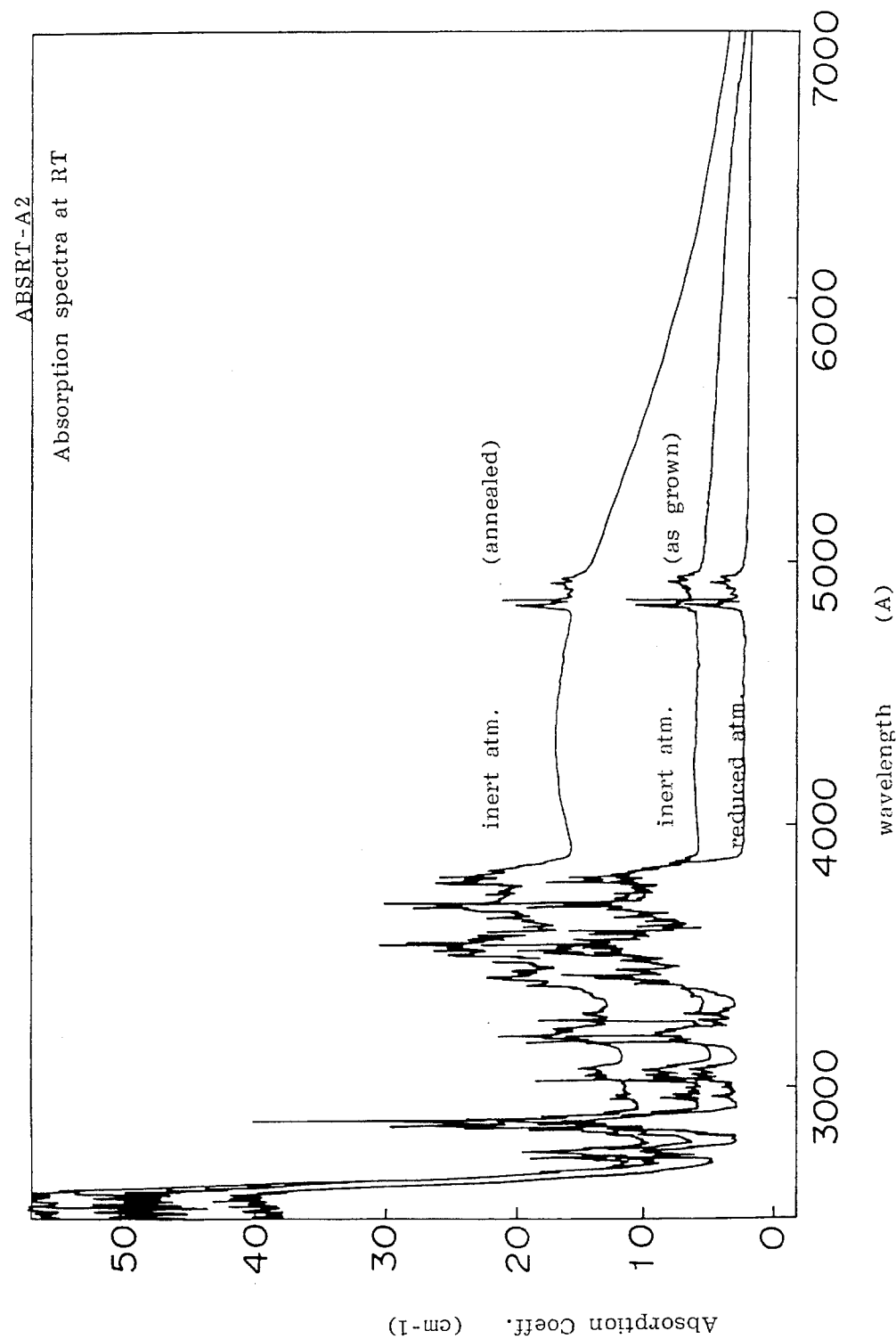
FIG. 1 is a graph showing absorption spectra of $TbAlO_3$ single crystals grown and annealed in various atmospheres.

As mentioned above, the material according to the present invention is composed of a single crystal or polycrystal having a composition containing at least terbium, aluminum and oxygen and represented by the formula $Tb_{1-x}Al_{1+x}O_3$ wherein $-0.5 \leq x \leq 0.5$. The emission color can be controlled, since the lattice constant can be controlled by adjusting the x value within this range. On the other hand, if the x value exceeds this range, other phases tend to precipitate in the crystal, such being undesirable.

In the above formula, the terbium site may be partly substituted by a Group IIIa element, or the aluminum site may be partly substituted by a Group IIIb element.

Now, the present invention will be described with reference to a composition of $TbAlO_3$ (x=0) as an example. For example, the luminescent life time can be controlled by substituting a part of Tb by La as a Group IIIa element. It is generally known that with a luminescent material, as the concentration of the added optically active ions increases, the luminous intensity tends to be not proportional to the added amount, and the emission eventually ceases, and at the same time, the luminescent life time tends to be short (i.e. concentration quenching). The significance of the substitution in the present invention is totally different from the case of such a conventional phosphor, although when represented by a chemical formula, it may be similar to the case of the conventional phosphor.

Namely, in the case of substitution by yttrium, the chemical formula is represented by $Tb_{1-x}Y_xAlO_3$. In the conventional technique, this means that Tb as an optically active element is added to an optically inactive matrix $YAlO_3$. Whereas, according to the present invention, a Group IIIa element such as yttrium, lanthanum or gadolinium, is added to prolong the luminescent life time of an optically active compound TbAlO$_3$. Thus, the function and significance of the substitution according to the present invention are fundamentally different from the conventional technique. Trivalent terbium resembles neodymium in its energy level, and its emission wavelength is in a visible wavelength region (about 530 to 550 nm). Therefore, it is capable of forming a visible solid fourth level laser. As compared with neodymium, it has many absorption peaks in a wavelength region of not higher than 400 nm, whereby it is advantageous for absorption of an excitation energy of e.g. a xenon lamp. At the same time, its absorption from the ground state very well agrees to the oscillation line of an argon ion laser of 488 nm, and thus it provides an advantageous condition for continuous oscillation.

On the other hand, as phosphor material, rare earth ions tend to show a long luminescent life, since they are usually in partially allowed transition. A luminescent material having terbium incorporated in an amount as small as a few % has a particularly long luminescent life at a level of from about 2 to 5 msec. However, as shown by the Examples given hereinafter, when 10% of terbium is substituted by cerium, the luminescent life time will be remarkably shortened, and no substantial decrease will be observed in its luminous intensity.

As described in the foregoing, the terbium aluminate of the present invention is a substance having excellent properties as a luminescent material for a laser material or for a phosphor.

A single crystal or polycrystal of this terbium aluminate is produced by growing it using a reducing gas atmosphere or a neutral gas atmosphere as the atmosphere by a well known single crystal or polycrystal growing method such as a Czochralski method other than a flux method.

The reducing gas atmosphere may, for example, be of hydrogen, carbon monoxide or a gas mixture having a hydrogen or carbon monoxide incorporated to a neutral gas such as nitrogen or argon. Likewise, the neutral gas atmosphere may, for example, be of an inert gas such as nitrogen or argon. The reducing gas atmosphere is preferred. It is also possible to employ an atmosphere having a reducing property imparted to some extent to a neutral gas.

Further, it is preferred to employ a crucible made of a reducing material such as graphite.

Now, the present invention will be described in further detail with reference to Examples. However, it should be understood that the present invention is by no means restricted by such specific Examples.

EXAMPLE 1

A TbAlO$_3$ single crystal was grown by a Czochralski method. The growth temperature was about 1900° C.

FIG. 1 shows the effects of various growing atmospheres by absorption spectra.

In FIG. 1, the spectrum identified with "inert atm. (as grown)" is the absorption spectrum of the crystal grown in an inert atmosphere, "inert atm. (annealed)" represents the absorption spectrum of the same crystal annealed in atmospheric air, and "reduced atm." represents the absorption spectrum of the crystal grown in a reducing atmosphere (in a mixed gas stream comprising 20% hydrogen and 80% nitrogen).

Since the growth temperature is about 1900° C., even an inert gas atmosphere may have a reducing nature to some extent, but such a reducing nature is not sufficient. Accordingly, a broad absorption is observed in the vicinity of 450 nm, and this absorption appears as a strong band absorption when annealed (the spectrum identified as "inert atm. (annealed)"). This absorption peak is believed to be attributable to tetravalent terbium.

Figure 2:
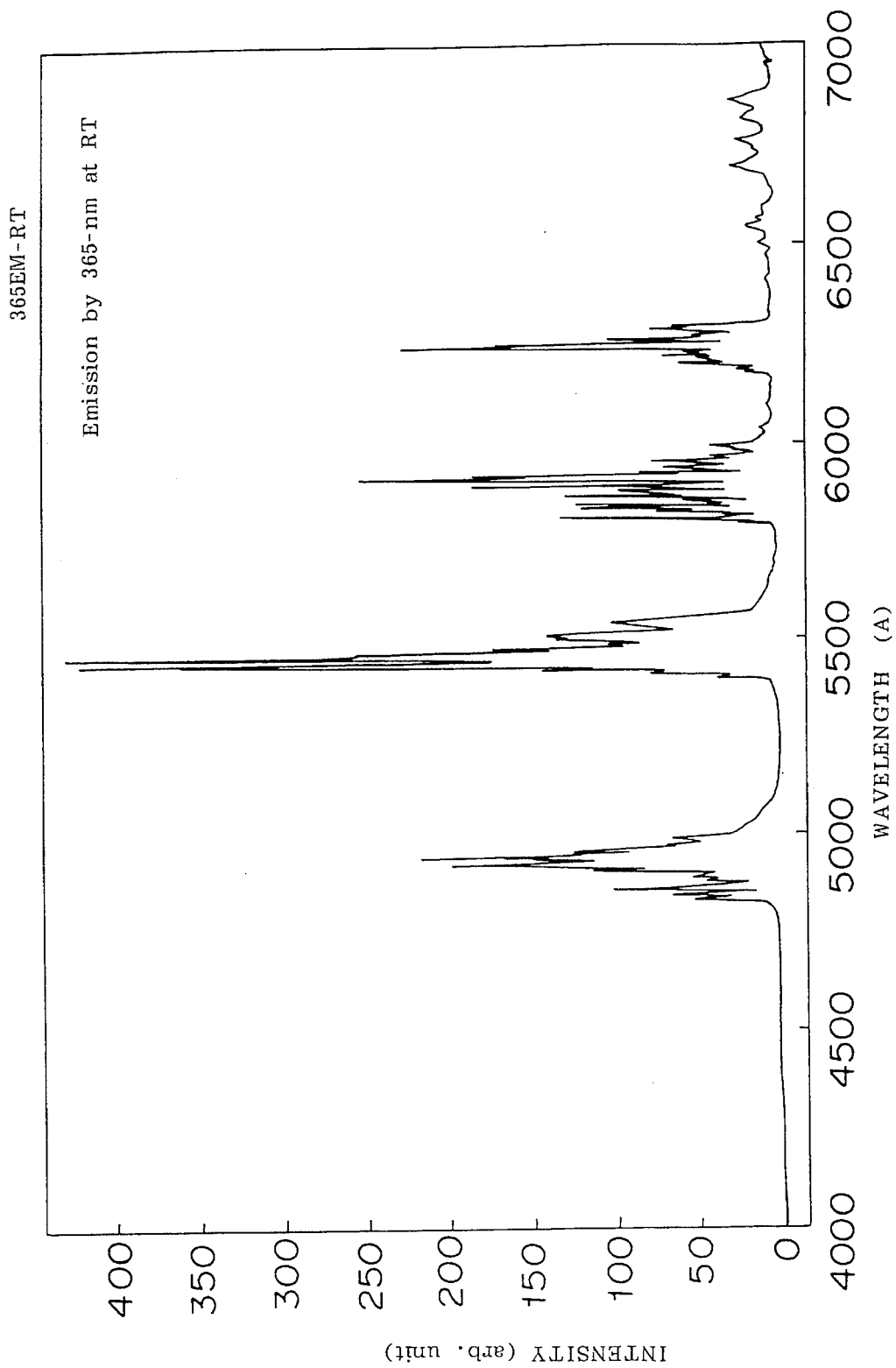
FIG. 2 is a graph showing an emission spectrum of a $TbAlO_3$ single crystal obtained in a reducing atmosphere in Example 1.

On the other hand, it is evident that the spectrum of "reduced atm." has no absorption other than the absorption from $^7F_6$ multiplet to $^5D_4$ multiplet of terbium in the vicinity of 480 nm. Accordingly, the crystal is excellent in the transparency and in fact is a colorless. FIG. 2 shows the emission spectrum of this "reduced atm." crystal.

EXAMPLE 2

Figure 3:
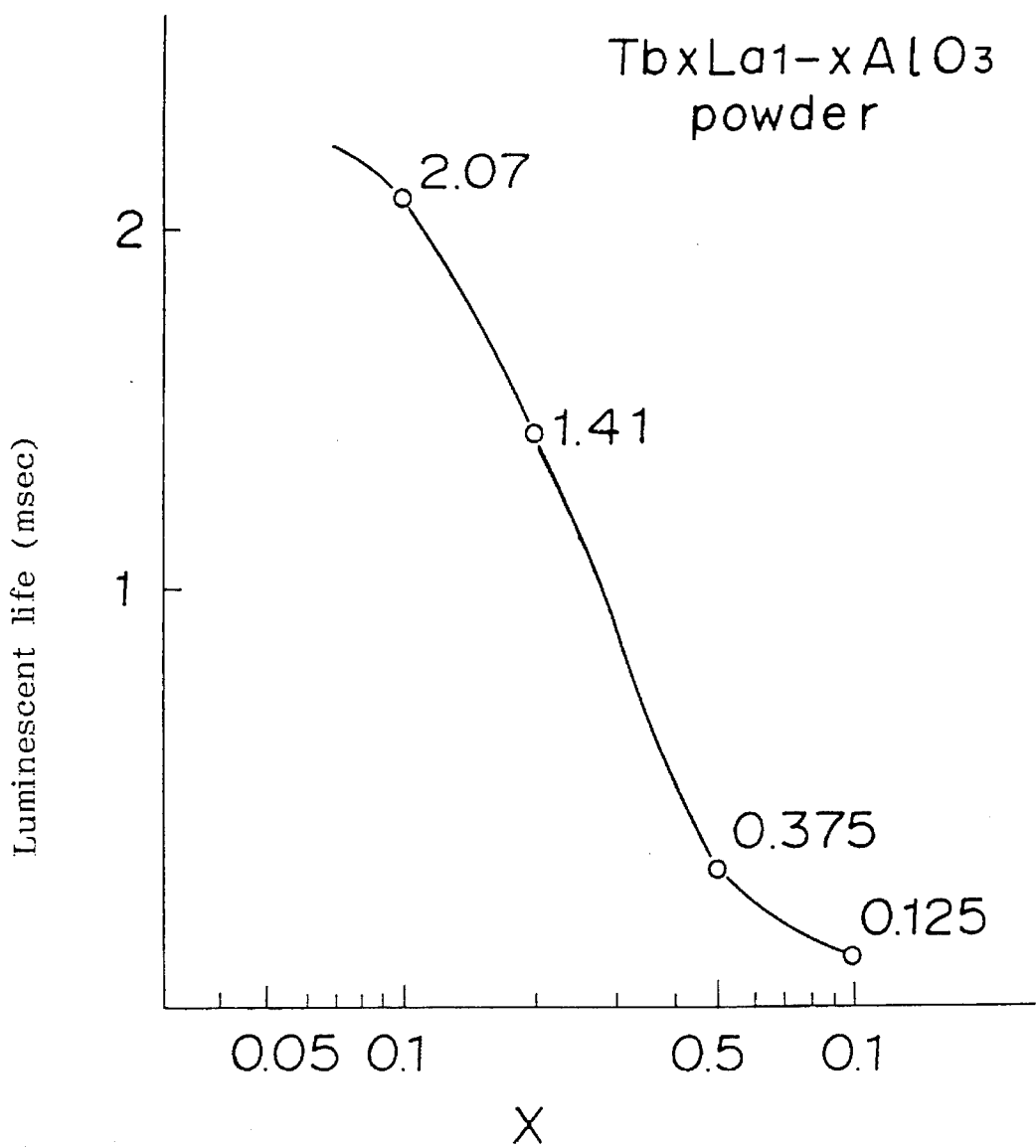
FIG. 3 is a graph showing a change in the luminescent life time of a sintered body of polycrystal having a part of terbium substituted by lanthanum in Example 2.

FIG. 3 shows the change in the luminescent life time of a polycrystal of Tb$_x$L$_{1-x}$AlO$_3$. It is evident from the Figure that the above mentioned concentration quenching phenomenon is observed, and the luminescent life is as short as 125 μsec at x=1.0, while it is 2.07 msec at x=0.1. However, usually, the luminous intensity tends to be weak as diluted by La, and it is possible to select the luminous intensity depending upon the particular use.

EXAMPLE 3

Figure 4:
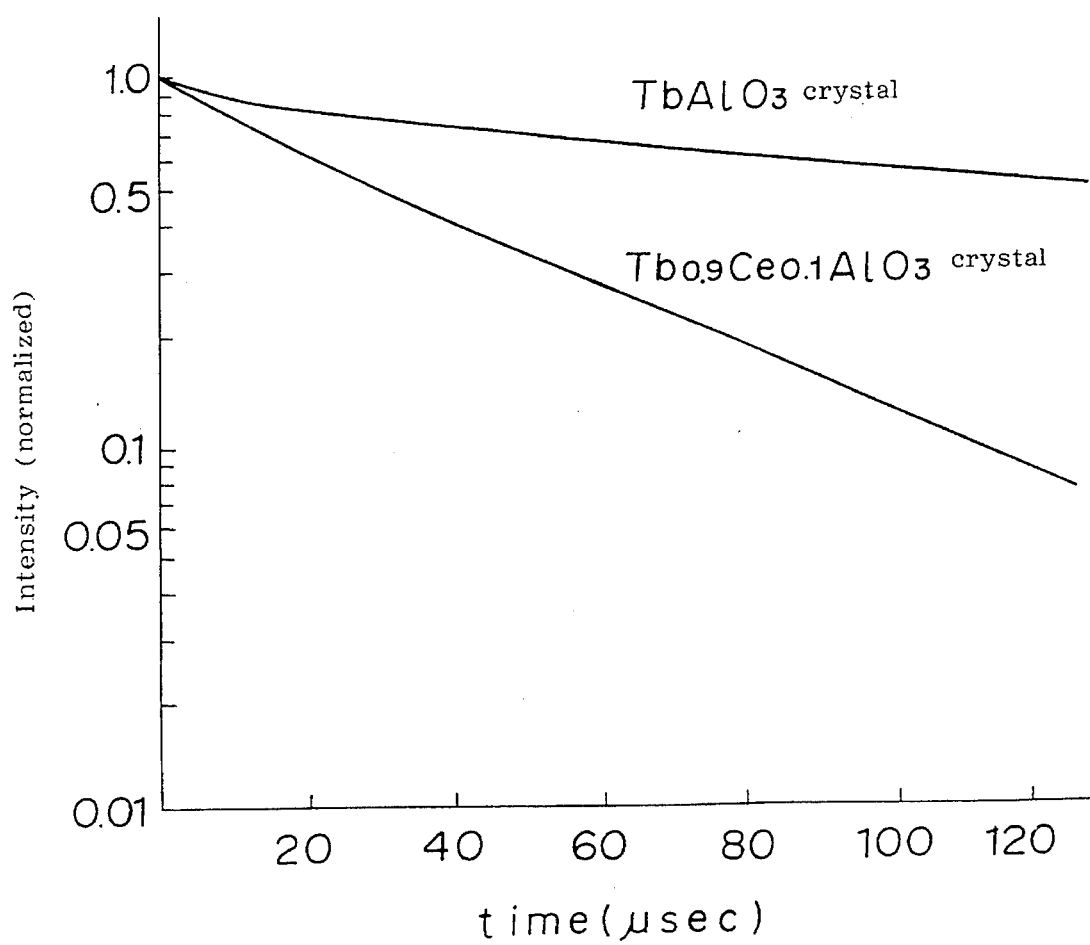
FIG. 4 is a graph showing an attenuation curve of the emission of a single crystal having a part of terbium substituted by cerium in Example 3.

In Example 1, a single crystal having 10% of terbium substituted by cerium, was grown. FIG. 4 shows the attenuation curve of its emission. Due to some energy transfer phenomenon occurring among terbium ions, the attenuation can not be represented by a simple exponential function. However, if the luminescent life is taken as the time until the intensity becomes to be the initial intensity of 1/e, the TbAlO$_3$ single crystal has a luminescent life of 180 μsec, whereas the single crystal with 10% substituted cerium has a luminescent life of 45 μsec, thus indicating that the crystal substituted by cerium is effective as a cathode ray phosphor for scanning at a high speed.

EXAMPLE 4

This Example is an example wherein a single crystal was grown by a floating zone melting method (a FZ method). The apparatus used for the FZ method was an infrared image furnace having a gold-plated reflector on the inner surface. As the light source, a halogen lamp with a maximum output of 5 kW, was used.

A raw material rod was prepared as follows. As starting materials, terbium oxide Tb$_4$O$_7$ (purity: 5N) and aluminum oxide (purity: 5N) were used. The respective ignition losses were measured. Then, the respective powders were weighed so that the atomic ratio would be Tb:Al=1:1, and after adding ethanol, the mixture was mixed for 24 hours by a ball mill method. Then, ethanol was separated, and about 10 g of the dried powder mixture was molded into a rod, which was then subjected to cold hydraulic pressing under a pressure of 4000 kg/cm$^2$. The shape after the pressing was a rod-shape having a diameter of about 6 mm and a length of about 60 mm. Then, this molded product was placed in a container made of graphite and calcined in an electric furnace. The calcination conditions were such that the atmosphere was N$_2$+2%H$_2$, the temperature was 1600° C., the retention time was 20 hours and the temperature raising speed was about 150° C./hr. Before the calcination, the molded product was slightly brown, but after the calcination, it turned to white. The shape after the calcination was a rod shape having a diameter of about 5 mm and a length of about 50 mm.

Then, the crystal growth by means of an infrared ray image furnace was carried out as follows. The calcined weight-reduced rod was attached to the upper main axis. To the lower main axis, a seed crystal of $TbAlO_3$ (3 mm× 3 mm×15 mm) previously cut out in the c-axial direction, was attached and adjusted so that the weight-reduced rod and the seed crystal would not be eccentric to each other. A quartz tube was disposed around the upper and lower axes so that the atmosphere would be controlled. In this Example, a mixture of $N_2+2\%H_2$ was supplied at a flow rate of 2 l/min as the atmospheric gas.

Then, while rotating the raw material rod at a rotational rate of 10 rotations per minute, its forward end was adjusted to the focus of the halogen lamp, and then the halogen lamp was switched on and its output was gradually raised. At an output of about 3.8 kW, the forward end of the raw material rod melted. Then, the seed crystal was gradually ascended while rotating it at a rotational rate of 10 rotations per minute in a direction opposite to the rotational direction of the raw material rod and connected to the molten zone. The system was maintained in this state for about 15 minutes, and after confirming that the molten zone was stable, the. raw material rod and the seed crystal were simultaneously descended at a rate of 2 mm/hr, whereby a crystal was grown. During the crystal growth, the output of the halogen lamp was adjusted so that the length of the molted zone was constant. After growing the crystal for about 20 hours, the raw material rod was moved upwards while gradually lowering the output of the halogen lamp, and the grown crystal was separated from the molten zone. Thereafter, the output of the halogen lamp was lowered to 0 over a period of about 5 hours, whereby the crystal was gradually cooled. The obtained crystal was colorless transparent and had a shape having a diameter of about 4 mm and a length of about 40 mm. No bubbles or cracks were observed.

EXAMPLE 5

This Example is an example wherein a single crystal was grown by a vertical Bridgeman method. For the crystal growth, a container made of graphite was employed. The container had a shape such that the inner diameter was 45 mm, the length of a cylindrical portion was 590 mm, the bottom was tapered with a tapering angle of 45°, and its forward end had a structure so that a seed crystal of 5 mm×5 mm×10 mm could be placed. In this container, a seed crystal previously cut out along the c-axis, was placed, and about 450 g of a powder mixed in the same manner as in Example 4, was filled in the container. Then, the powder-filled graphite container was placed in an electric furnace having a tungsten mesh as a heating element. The furnace was once evacuated to $10^{-3}$ Torr, and then a mixture of $Ar+3\%H_2$ was introduced thereinto as the atmospheric gas. Then, the heating element was heated by applying an electric current thereto, and the temperature gradient was adjusted. Then, the powder was melted. Then, the container was gradually cooled from the seed crystal side, whereby the crystal was grown. The container was gradually cooled to room temperature over a period of one week, and then the crystal was taken out. The obtained crystal was colorless transparent, and no bubbles or cracks were observed.

As described in the foregoing, according to the present invention, inclusion of tetravalent terbium is prevented, and it is possible to provide a luminescent material composed of a single crystal or polycrystal of high quality which is free from cracking and colorless transparent and which exhibits a yellowish green or green color.

What is claimed is:

1. A method for producing a single crystal or polycrystal of terbium aluminate containing at least terbium, aluminum and oxygen and represented by the formula $Tb_{1-x}Al_{1+x}O_3$ wherein $-0.5 \leq x \leq 0.5$, which comprises growing the single crystal or polycrystal by a bulk growth method without a flux in a reducing gas atmosphere or a neutral gas atmosphere.

2. The method according to claim 1, wherein a crucible made of a reducing material, is employed.

3. The method according to claim 1, wherein the terbium site of the terbium aluminate is partly substituted by a Group IIIa element.

4. The method according to claim 1, wherein the aluminum site of the terbium aluminate is partly substituted by a Group IIIb element.

5. A single crystal or polycrystal of terbium aluminate having a composition containing at least terbium, aluminum and oxygen and represented by the formula $Tb_{1-x}Al_{1+x}O_3$ wherein $-0.5 \leq x \leq 0.5$, which exhibits a green or yellowish green emission in a visible wavelength region at room temperature,
wherein the terbium site of terbium aluminate is partly substituted by a Group IIIa or the aluminum site is partly substituted by a Group IIIb element.

6. A single crystal or polycrystal of terbium aluminate having a composition containing at least terbium, aluminum and oxygen and represented by the formula $Tb_{1-x}Al_{1+x}O_3$ wherein $-0.5 \leq x \leq 0.5$, which has no absorption in a visible wavelength region other than absorption from $^7F_6$ multiplet to $^5D_4$ multiplet of terbium,
wherein the terbium site of the terbium aluminate is partly substituted by a Group IIIa or the aluminum site is partly substituted by a Group IIIb element.

7. The single crystal or polycrystal of terbium aluminate according to claim 6, wherein the terbium site of terbium aluminate is partly substituted by a Group IIIa element.

8. The single crystal or polycrystal according to claim 6, wherein the aluminum site of the terbium aluminate is partly substituted by a Group IIIb element.

9. The method of claim 1, wherein the terbium site of the terbium aluminate is partly substituted by an element selected from the group consisting of lanthanum, yttrium, gadolinium and cerium.

10. The method of claim 1, wherein 0–10 atomic % of the terbium site of the terbium aluminate is substituted by cerium.

11. The method of claim 1, wherein said growing is in said reducing gas atmosphere.

12. The method of claim 1, wherein said reducing gas atmosphere or said neutral gas atmosphere is selected from the group consisting of hydrogen, carbon monoxide, nitrogen and argon.

13. The method of claim 1, wherein during said growing said terbium aluminate is melted.

14. The method of claim 1, wherein said growing of said single crystal is performed by a process selected from the group consisting of Czochralski method, float zone melting method and Bridgeman method.

15. The method of claim 1, wherein said single crystal or polycrystal comprises no tetravalent terbium.

16. The method of claim 2, wherein said crucible comprises graphite.

17. The single crystal or polycrystal of claim 6, wherein the terbium site of terbium aluminate is partly substituted by an element selected from the group consisting of lanthanum, ytrrium, gadolinium and cerium.

18. The single crystal or polycrystal of claim 6, wherein at most 10 atomic % of the terbium site of terbium aluminate is substituted by cerium.

19. The single crystal or polycrystal of claim 6, wherein said single crystal or polycrystal comprises no tetravalent terbium.

* * * * *